(12) United States Patent
Hirabayashi

(10) Patent No.: US 7,382,674 B2
(45) Date of Patent: Jun. 3, 2008

(54) STATIC RANDOM ACCESS MEMORY (SRAM) WITH CLAMPED SOURCE POTENTIAL IN STANDBY MODE

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 224 days.

(21) Appl. No.: 11/401,933

(22) Filed: Apr. 12, 2006

(65) Prior Publication Data

US 2007/0147147 A1 Jun. 28, 2007

(30) Foreign Application Priority Data

Dec. 26, 2005 (JP) ............................. 2005-373516

(51) Int. Cl.
G11C 5/14 (2006.01)
G11C 11/413 (2006.01)
G11C 29/00 (2006.01)

(52) U.S. Cl. .................... 365/226; 365/201; 365/154; 365/229

(58) Field of Classification Search ................ 365/201, 365/226, 227, 229, 154, 189.06, 189.09
See application file for complete search history.

(56) References Cited

U.S. PATENT DOCUMENTS 6,999,338 B1 2/2006 Hirabayashi
2004/0227542 A1* 11/2004 Bhavnagarwala et al. ..... 326/83

OTHER PUBLICATIONS

Masanao Yamaoka, et al. "A 300MHz 25 μA/Mb Leakage On-Chip SRAM Module Featuring Process-Variation Immunity and Low-Leakage Active Mode for Mobile-Phone Application Processor", 2004 IEEE International Solid-State Circuits Conference, Feb. 18, 2004, 10 pages.
Y. Takeyama, et al. "A Low Leakage SRAM Macro with Replica Cell Biasing Scheme", 2005 Symposium on VLSI Circuits Digest of Technical Papers, 2005, pp. 166-167.
U.S. Appl. No. 11/219,827, filed Sep. 7, 2005, Osamu Hirabayashi.

* cited by examiner

*Primary Examiner*—J. H. Hur
(74) *Attorney, Agent, or Firm*—Oblon, Spivak, McClelland, Maier & Neustadt, P.C.

(57) ABSTRACT

A semiconductor memory device includes a memory cell array including a plurality of memory cells, a source terminal which supplies a source potential to the memory cells, a first switching element which electrically connects the source terminal and a first power supply potential in an operation mode of the memory cells, and electrically disconnects the source terminal and the first power supply potential in a standby mode of the memory cells, a clamp MIS transistor which is series-connected between the source terminal and the first power supply potential, and clamps the source potential in the standby mode, a bias generation circuit which supplies a first bias potential to a gate terminal of the clamp MIS transistor, and a switching circuit which switches a potential of a back gate terminal of the clamp MIS transistor between a test mode and a non-test mode.

20 Claims, 9 Drawing Sheets

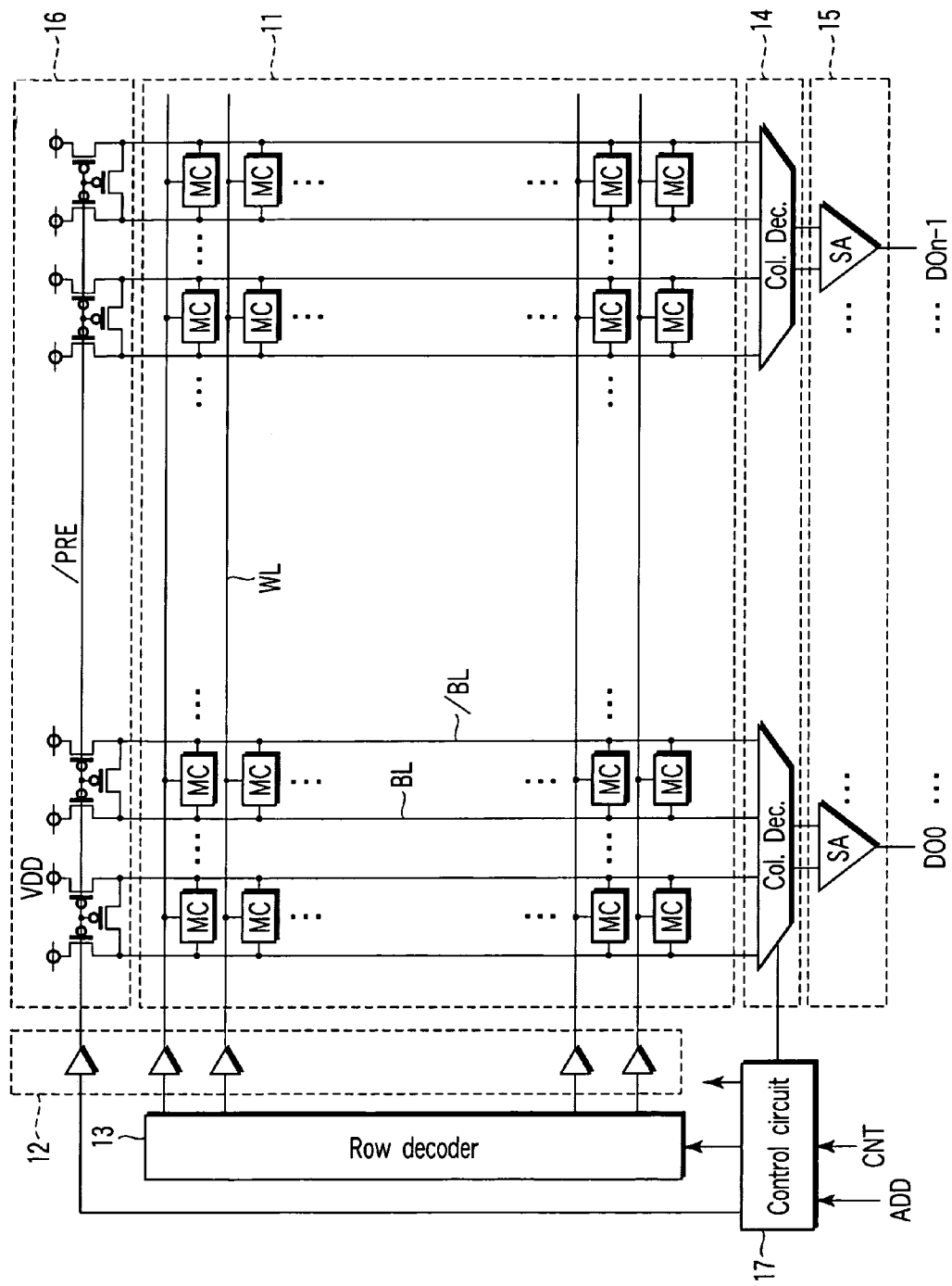
F I G. 1

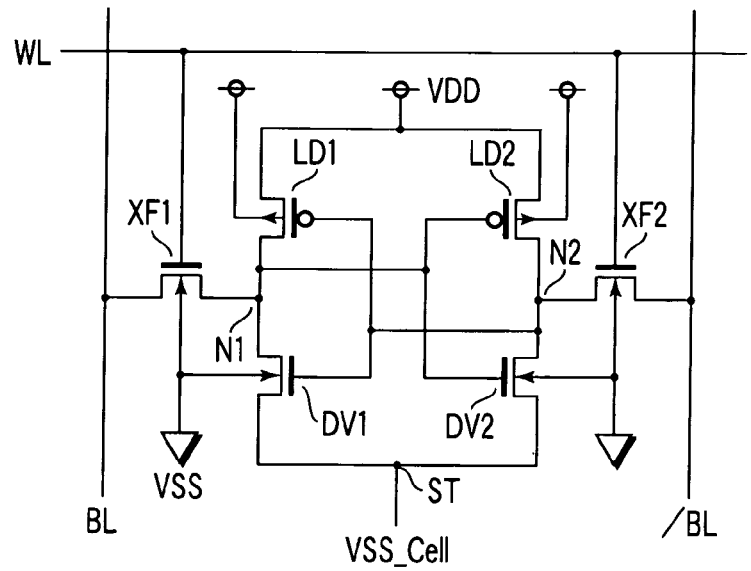
F I G. 2
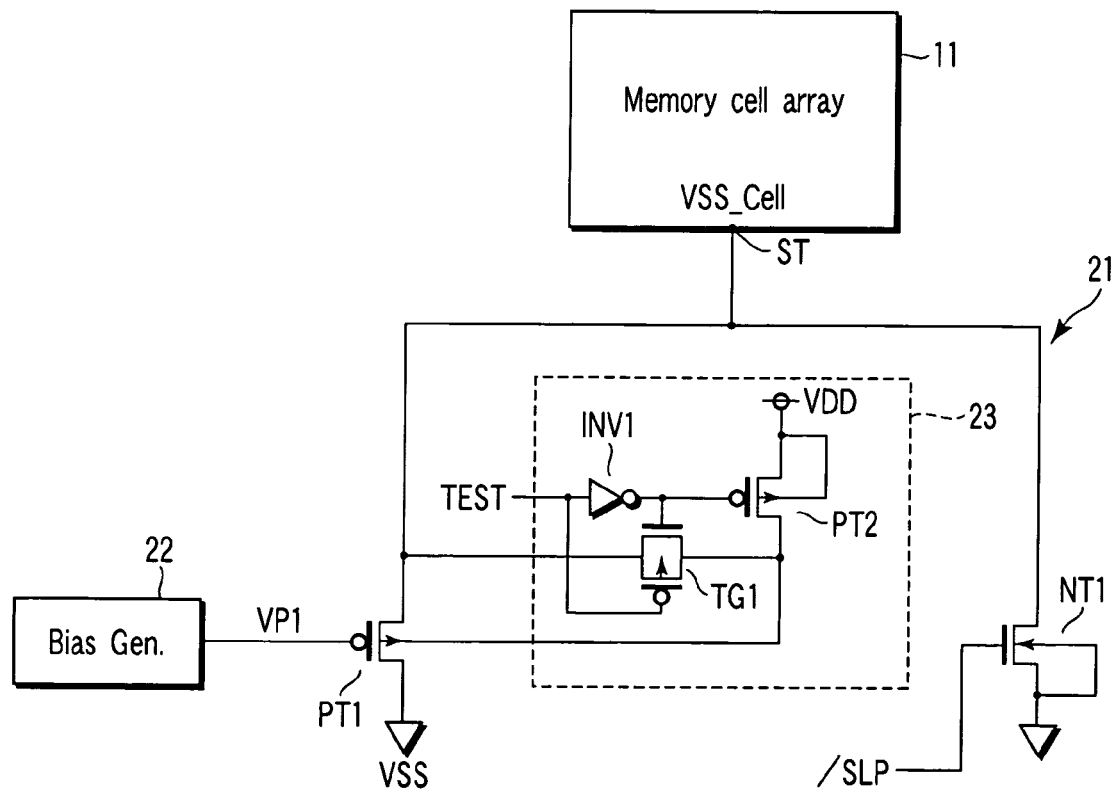
F I G. 3

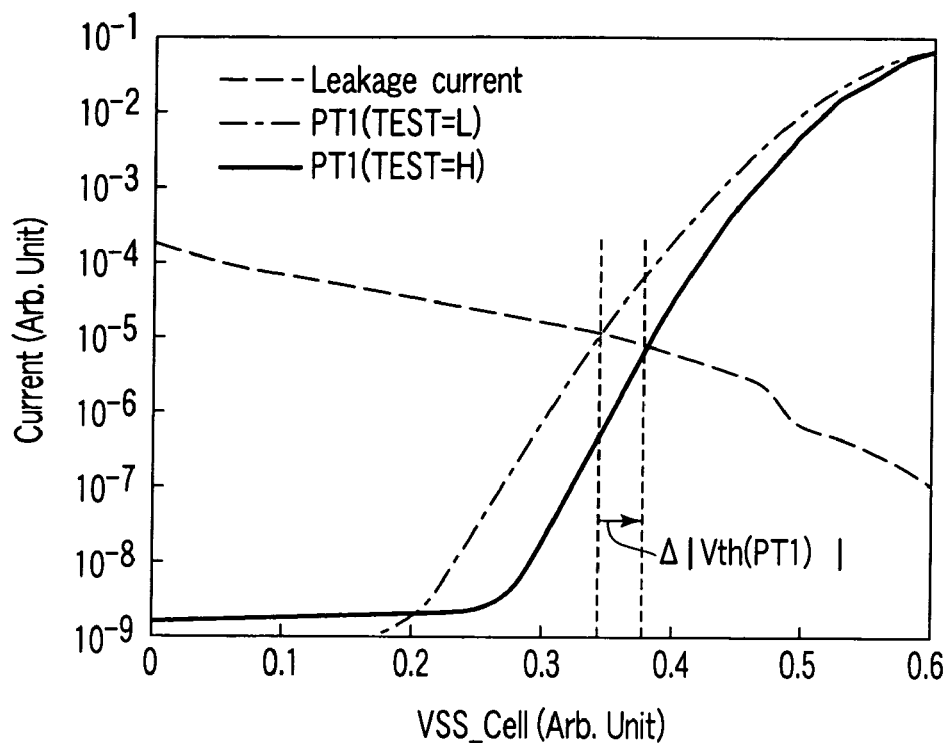
F I G. 6
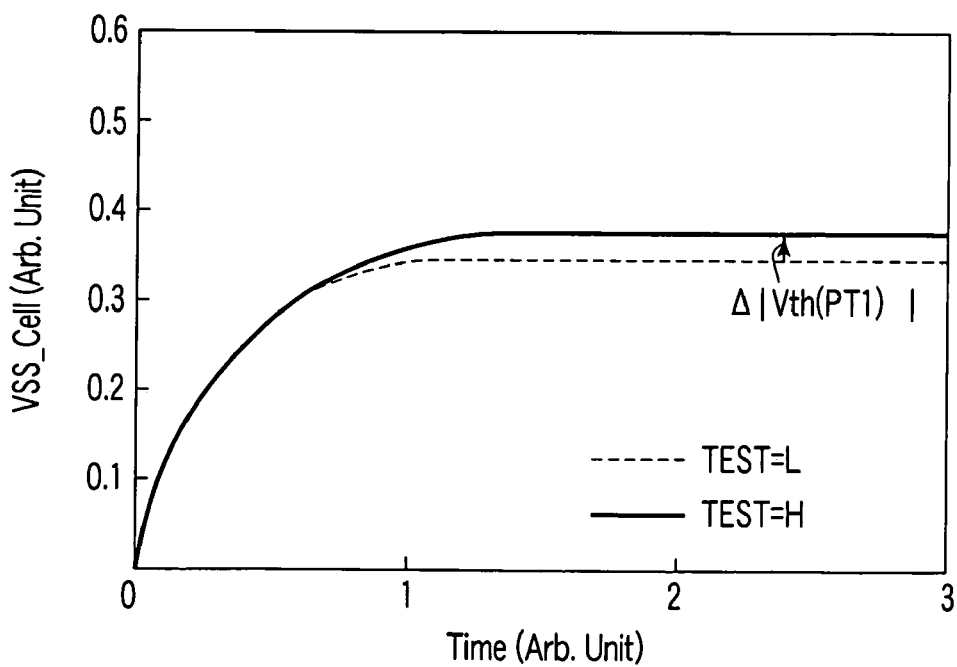
F I G. 7

STATIC RANDOM ACCESS MEMORY (SRAM) WITH CLAMPED SOURCE POTENTIAL IN STANDBY MODE

CROSS-REFERENCE TO RELATED APPLICATIONS

This application is based upon and claims the benefit of priority from prior Japanese Patent Application No. 2005-373516, filed Dec. 26, 2005, the entire contents of which are incorporated herein by reference.

BACKGROUND OF THE INVENTION

1. Field of the Invention

The present invention relates to a semiconductor memory device and semiconductor integrated circuit and, more particularly, to an SRAM (Static Random Access Memory) including a static memory cell.

2. Description of the Related Art

SRAMs are widely used in general LSIs (Large-Scale Integrated circuits). Along with a reduction in size and a reduction in voltage of LSIs, the SRAM is suffering an increase in power consumption by the leakage current in the standby mode.

More specifically, an SRAM cell has two load P-channel MOS (Metal Oxide Semiconductor) transistors and two driving N-channel MOS transistors. The SRAM cell stores data by turning on/off these MOS transistors. In the MOS transistors, as the gate oxide film becomes thinner, a leakage current (gate leakage) which tunnels and flows through a gate oxide film increases. As the threshold voltage reduces upon a reduction of the power supply voltage, a leakage current (subthreshold leakage) in the OFF state also increases.

As a method of reducing these leakage currents, there is proposed a method of controlling a potential supplied to a memory cell array in the standby mode, and relaxing the cell bias (see reference (Y. Takeyama et al., "A Low Leakage SRAM Macro with Replica Cell Biasing Scheme", 2005 Symposium on VLSI Circuits Digest of Technical Papers, pp. 166-167)).

In an SRAM in which a source potential VSS_Cell in the memory cell array changes to high level in the standby mode as disclosed in the above reference, the cell bias decreases more than in a normal SRAM, degrading the data retention characteristic. Before a chip is shipped as a product, it must be checked whether the SRAM has a sufficient operating margin. More specifically, in a shipping test, a chip of an insufficient margin must be screened by setting the cell bias lower than that in normal use.

However, this SRAM operates to always keep a predetermined cell bias regardless of variations in power supply potential VDD. Even if the external power supply is simply decreased, screening fails.

BRIEF SUMMARY OF THE INVENTION

According to a first aspect of the present invention, there is provided a semiconductor memory device comprising:

a memory cell array including a plurality of memory cells each of which is of a static type and includes a driving MIS (Metal Insulator Semiconductor) transistor and a load MIS transistor;

a source terminal which supplies a source potential to the memory cells;

a first switching element which electrically connects the source terminal and a first power supply potential in an operation mode of the memory cells, and electrically disconnects the source terminal and the first power supply potential in a standby mode of the memory cells;

a clamp MIS transistor which is series-connected between the source terminal and the first power supply potential, and clamps the source potential in the standby mode;

a bias generation circuit which supplies a first bias potential to a gate terminal of the clamp MIS transistor; and a switching circuit which switches a potential of a back gate terminal of the clamp MIS transistor between a test mode and a non-test mode.

According to a second aspect of the present invention, there is provided a semiconductor memory device comprising:

a memory cell array including a plurality of memory cells each of which is of a static type and includes a driving MIS transistor and a load MIS transistor;

a first source terminal which supplies a source potential to the memory cells;

a first switching element which electrically connects the first source terminal and a first power supply potential in an operation mode of the memory cells, and electrically disconnects the first source terminal and the first power supply potential in a standby mode of the memory cells;

a clamp MIS transistor which has a source terminal connected to the first source terminal, and clamps the source potential in the standby mode;

a bias generation circuit which supplies a bias potential to a gate terminal of the clamp MIS transistor; and a switching circuit which switches a potential of a drain terminal of the clamp MIS transistor between a test mode and a non-test mode.

According to a third aspect of the present invention, there is provided a semiconductor integrated circuit comprising:

an SRAM (Static Random Access Memory) macro; and a test circuit which executes a test for the SRAM macro, the SRAM macro comprising a memory cell array including a plurality of memory cells each of which is of a static type and includes a driving MIS transistor and a load MIS transistor;

a source terminal which supplies a source potential to the memory cells;

a first switching element which electrically connects the source terminal and a first power supply potential in an operation mode of the memory cells, and electrically disconnects the source terminal and the first power supply potential in a standby mode of the memory cells;

a clamp MIS transistor which is series-connected between the source terminal and the first power supply potential, and clamps the source potential in the standby mode;

a bias generation circuit which supplies a first bias potential to a gate terminal of the clamp MIS transistor; and a switching circuit which switches a potential of a back gate terminal of the clamp MIS transistor between a test mode and a non-test mode.

BRIEF DESCRIPTION OF THE SEVERAL VIEWS OF THE DRAWING

FIG. 1 is a block diagram illustrating an SRAM according to the first embodiment of the present invention;

FIG. 2 is a circuit diagram illustrating a memory cell MC contained in a memory cell array 11 shown in FIG. 1;

FIG. 3 is a circuit diagram illustrating a cell bias control circuit 21 according to the first embodiment of the present invention;

FIG. 6 is a graph illustrating the leakage current of the memory cell array 11 and the load characteristic of a PMOS transistor PT1;

FIG. 7 is a chart illustrating a level change in source potential VSS_Cell after the SRAM enters the standby mode according to the first embodiment;

DETAILED DESCRIPTION OF THE INVENTION

Figure 4:
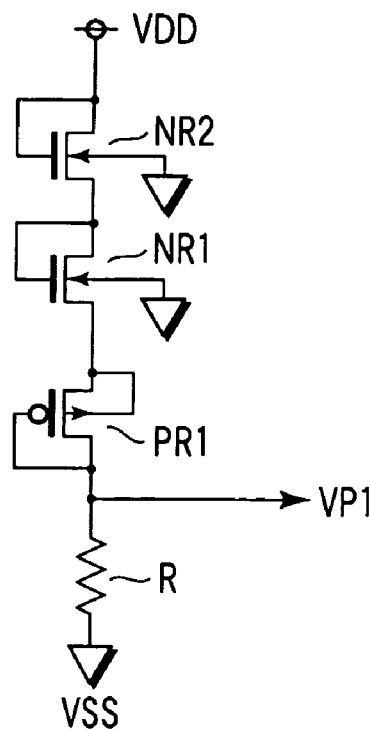
FIG. 4 is a circuit diagram illustrating an example of a bias generation circuit 22.

Preferred embodiments of the present invention will be described below with reference to the several views of the accompanying drawing. In the following description, the same reference numerals denote elements having the same functions and arrangements, and a repetitive description will be made only when needed.

FIRST EMBODIMENT

FIG. 1 is a block diagram illustrating an SRAM according to the first embodiment of the present invention. The SRAM comprises a memory cell array 11 which includes a plurality of static memory cells MC arranged in a matrix. In the memory cell array 11, a plurality of word lines WL are arranged. The word lines WL extend the row direction. Also in the memory cell array 11, a plurality of pairs of bit lines BL and /BL are arranged. The pairs of bit lines BL and /BL extend the column direction. A row of the memory cell array 11 is selected by the word line WL. A column of the memory cell array 11 is selected by a pair of bit lines BL and /BL.

The word lines WL are connected to a row decoder 13 via a word line driver circuit 12. The row decoder 13 selects a corresponding one of the word lines WL on the basis of a row address signal.

The pairs of bit lines BL and /BL are connected to a column decoder (Col. Dec.) 14. The column decoder 14 selects a corresponding pair from the pairs of bit lines BL and /BL on the basis of a column address signal.

A sense amplifier circuit 15 comprises a plurality of sense amplifiers SA. The sense amplifier circuit 15 senses and amplifies data which are read out from the memory cell array 11 via the column decoder 14. The sense amplifier circuit 15 outputs the sensed data as output data DO0 to DO$_{n-1}$.

A precharge circuit 16 precharges the pair of bit lines BL and /BL to, e.g., a power supply potential VDD before read and write are executed. The precharge circuit 16 executes a precharge operation on the basis of a precharge signal /PRE. The precharge circuit 16 precharges the pair of bit lines BL and /BL to the power supply potential VDD when the precharge signal /PRE is at low level, and cancels precharging when the precharge signal /PRE is at high level.

A control circuit 17 controls each circuit in the SRAM. The control circuit 17 externally receives an address signal ADD, control signal CNT, and the like. The control circuit 17 generates a row address signal to be supplied to the row decoder 13 and a column address signal to be supplied to the column decoder on the basis of the address signal ADD. The control circuit 17 generates a precharge signal /PRE to be supplied to the precharge circuit 16 on the basis of, e.g., the control signal CNT.

FIG. 2 is a circuit diagram illustrating a memory cell MC included in the memory cell array 11 shown in FIG. 1. The memory cell MC comprises first and second inverter circuits. The first inverter circuit comprises a load P-channel MOS (Metal Oxide Semiconductor) transistor (PMOS transistor) LD1 and a driving N-channel MOS transistor (NMOS transistor) DV1. The PMOS transistor LD1 and NMOS transistor DV1 are series-connected between the power supply potential VDD (or terminal which receives the power supply potential VDD) and a source terminal ST (terminal which receives a source potential VSS_Cell of the driving NMOS transistor).

The source potential VSS_Cell is a lower one of power supply potentials supplied to the memory cell array 11, and is set to a potential which is equal to or higher than a ground potential VSS and lower than the power supply potential VDD. The source potential VSS_Cell changes under the control of a cell bias control circuit 21 (to be described later).

The second inverter circuit comprises a load PMOS transistor LD2 and driving NMOS transistor DV2. The PMOS transistor LD2 and NMOS transistor DV2 are series-connected between the power supply potential VDD and the source potential VSS_Cell (source terminal ST).

More specifically, the source terminal of the PMOS transistor LD1 is connected to the power supply potential VDD. The drain terminal of the PMOS transistor LD1 is connected to that of the NMOS transistor DV1 via a memory node N1. The gate terminal of the PMOS transistor LD1 is connected to that of the NMOS transistor DV1. The back gate terminal (substrate gate terminal) of the PMOS transistor LD1 is connected to the power supply potential VDD. The source terminal of the NMOS transistor DV1 is connected to the source potential VSS_Cell. The back gate terminal of the NMOS transistor DV1 is connected to the ground potential VSS.

The source terminal of the PMOS transistor LD2 is connected to the power supply potential VDD. The drain terminal of the PMOS transistor LD2 is connected to that of the NMOS transistor DV2 via a memory node N2. The gate terminal of the PMOS transistor LD2 is connected to that of the NMOS transistor DV2. The back gate terminal of the PMOS transistor LD2 is connected to the power supply potential VDD. The source terminal of the NMOS transistor DV2 is connected to the source potential VSS_Cell. The back gate terminal of the NMOS transistor DV2 is connected to the ground potential VSS.

The gate terminal of the PMOS transistor LD1 is connected to the memory node N2. The gate terminal of the PMOS transistor LD2 is connected to the memory node N1. In other words, the output of the first inverter circuit is connected to the input of the second inverter circuit, whereas the output of the second inverter circuit is connected to the input of the first inverter circuit.

The memory node N1 is connected to the bit line BL via an NMOS transistor XF1 serving as a transfer gate. The gate terminal of the NMOS transistor XF1 is connected to the word line WL. The back gate terminal of the NMOS transistor XF1 is connected to the ground potential VSS.

The memory node N2 is connected to the bit line /BL via an NMOS transistor XF2 serving as a transfer gate. The gate terminal of the NMOS transistor XF2 is connected to the word line WL. The back gate terminal of the NMOS transistor XF2 is connected to the ground potential VSS.

The SRAM according to the first embodiment comprises the cell bias control circuit 21. FIG. 3 is a circuit diagram illustrating the cell bias control circuit 21. The cell bias control circuit 21 is connected to the source terminal ST (or a source line) of the memory cell array 11, and controls the source potential VSS_Cell to be supplied to the source terminal ST. The cell bias control circuit 21 comprises a bias generation circuit (Bias Gen.) 22, level switching circuit 23, clamp PMOS transistor PT1, and NMOS transistor NT1 for supplying the ground potential VSS.

The drain terminal of the NMOS transistor NT1 is connected to the source terminal ST of the memory cell array 11. The source and back gate terminals of the NMOS transistor NT1 are connected to the ground potential VSS. The gate terminal of the NMOS transistor NT1 receives, e.g., a standby signal /SLP supplied from the control circuit 17.

The standby signal /SLP changes to high level in the normal operation mode, and changes to low level in the standby mode. By the standby signal /SLP, the NMOS transistor NT1 is turned on in the normal operation mode and off in the standby mode. In normal operation, access to the SRAM (including write and read of data in and from the memory cell) is executed. In the standby mode, power consumption is low, and the SRAM does not operate though it retains memory data (the SRAM is not accessed).

The source terminal of the PMOS transistor PT1 is connected to the source terminal ST. The drain terminal of the PMOS transistor PT1 is connected to the ground potential VSS. The gate terminal of the PMOS transistor PT1 receives a bias potential VP1 from the bias generation circuit 22.

The bias potential VP1 is used as a reference to increase the source potential VSS_Cell more than the ground potential VSS in order to reduce the leakage current of the memory cell MC in the standby mode. For this purpose, the bias potential VP1 is set between the power supply potential VDD and the ground potential VSS. Further, the bias potential VP1 is set to satisfy a condition under which data stored in the memory cell MC is not destroyed by the level rise of the source potential VSS_Cell. That is, the bias potential VP1 is set so that, among MOS transistors included in the memory cell MC, a MOS transistor which is ON in order to store arbitrary data can maintain the ON state.

FIG. 4 is a circuit diagram illustrating an example of the bias generation circuit 22. The bias generation circuit 22 is configured so that the bias potential VP1 reflects variations in the potential difference between the power supply potential VDD and the ground potential VSS, and variations (mainly a process error) in a threshold voltage Vth of the transistor. For this purpose, the bias generation circuit 22 is formed by series-connecting NMOS transistors NR2 and NR1, a PMOS transistor PR1, and a resistor R between the power supply potential VDD and the ground potential VSS in the order named from the supply terminal side of the power supply potential VDD.

The gate and drain terminals of each of the NMOS transistors NR1 and NR2 are connected (diode-connected). The back gate terminals of the NMOS transistors NR1 and NR2 are connected to the ground potential VSS. The gate and drain terminals of the PMOS transistor PR1 are connected. (diode-connected). The back gate terminal of the PMOS transistor PR1 is connected to its source terminal.

The NMOS transistors NR1 and NR2 are formed from, e.g., replica transistors of a driving NMOS transistor (DV1 or the like) included in the memory cell MC. That is, the NMOS transistors NR1 and NR2 are designed (formed in the same process) with the same specifications (size, layout pattern, and the like) and the same threshold voltage as those of the NMOS transistor DV1. By using the two replica transistors, a margin for the error of the threshold voltage can be ensured.

The PMOS transistor PR1 is formed from a replica transistor of the PMOS transistor PT1. The bias potential VP1 is output from the connection node (drain terminal of the PMOS transistor PR1) between the PMOS transistor PR1 and the resistor R.

In FIG. 3, the back gate terminal of the PMOS transistor PT1 is connected to the level switching circuit 23 for switching the potential level of the back gate terminal. The level switching circuit 23 receives, e.g., a test signal TEST supplied from the control circuit 17. The test signal TEST changes to high level in a screening test mode, and low level in a normal mode.

The screening test is to set stricter operation conditions for memory cells than those in normal use, and screen a chip which readily becomes defective, before the chip is shipped as a product. Note that the screening test is merely an example, and the type of test is not limited to the screening test. The normal mode is a state except for the screening test mode. That is, in the normal mode, a normal bias is supplied to the memory cells The test signal TEST is input to an inverter circuit INV1. A signal output from the inverter circuit INV1 is input to the gate terminal of a PMOS transistor PT2. The source and back gate terminals of the PMOS transistor PT2 are connected to the power supply potential VDD. The drain terminal of the PMOS transistor PT2 is connected to the back gate terminal of the PMOS transistor PT1.

The level switching circuit 23 comprises a transfer gate TG1. The transfer gate TG1 is formed by, e.g., parallel-connecting PMOS and NMOS transistors. The input terminal of the transfer gate TG1 is connected to the source terminal ST. The output terminal of the transfer gate TG1 is connected to the back gate terminal of the PMOS transistor PT1.

The first control terminal (corresponding to the gate terminal of the PMOS transistor) of the transfer gate TG1 receives the test signal TEST. The second control terminal (corresponding to the gate terminal of the NMOS transistor) of the transfer gate TG1 receives an inverted signal (signal output from the inverter circuit INV1) of the test signal TEST. That is, the transfer gate TG1 is turned on (electrically connects the input and output terminals) when the test signal TEST is at low level (in the normal mode).

Figure 5:
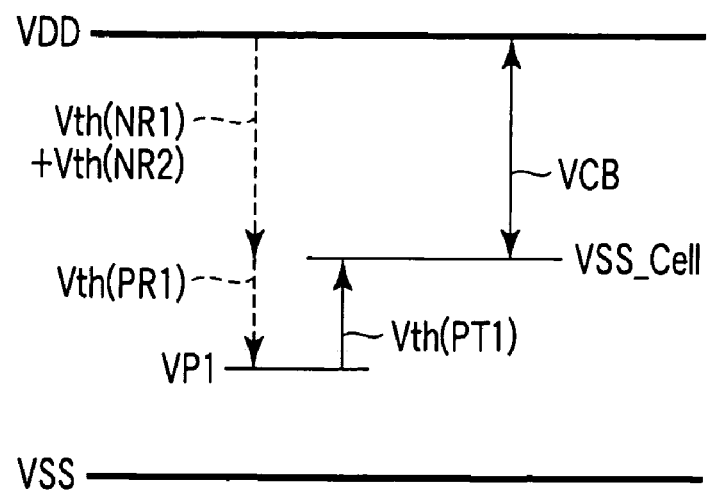
FIG. 5 is a chart illustrating the potential relationship of the SRAM in the standby mode according to the first embodiment.

The operation of the SRAM having the above arrangement will be explained. FIG. 5 is a chart illustrating the potential relationship of the SRAM in the standby mode. In the normal operation mode (/SLP=H), the NMOS transistor NT1 is turned on, and the source potential VSS_Cell changes to 0V (ground potential VSS).

In the standby mode (/SLP=L), the NMOS transistor NT1 is turned off. After the NMOS transistor NT1 is turned off, the source potential VSS_Cell gradually rises from 0V owing to the leakage current of the memory cell MC.

The gate terminal of the PMOS transistor PT1 receives the bias potential VP1. When the level of the source potential VSS_Cell rises from 0V and reaches a level higher than the bias potential VP1 by the threshold voltage Vth(PT1) of the PMOS transistor PT1, the PMOS transistor PT1 is turned on. As a result, the level of the source potential VSS_Cell is clamped (is held).

The bias generation circuit 22 generates the bias potential VP1 corresponding to a voltage lower than the power supply potential VDD by the sum of the threshold voltages Vth(NR1), Vth(NR2), and Vth(PR1) of the three replica transistors (NR1, NR2, and PR1). The bias generation circuit 22 monitors the replicas (NR1 and NR2) of the MOS transistor which forms the memory cell, and thereby controls the bias potential VP1 so as to obtain an optimal bias corresponding to the threshold voltage Vth of the MOS transistor. By decreasing a cell bias VCB applied to the memory cell MC in the standby mode, the leakage current can be effectively reduced while memory data is retained.

In the first embodiment, the potential of the back gate terminal of the clamp PMOS transistor PT1 is changed between the screening test mode and the normal mode.

In the normal mode (TEST=L), the PMOS transistor PT2 is OFF, and the transfer gate TG1 is ON. The back gate terminal of the PMOS transistor PT1 is connected to the source potential VSS_Cell.

In the screening test mode (TEST=H), the PMOS transistor PT2 is ON, and the transfer gate TG1 is OFF. The back gate terminal of the PMOS transistor PT1 is connected to the power supply potential VDD.

For example, VDD=1.2V, and VSS_Cell≈0.6V. In this case, in the normal mode, the source voltage of the PMOS transistor PT1=back gate voltage=VSS_Cell, so the voltage Vbs between the back gate and the source=0V.

In the screening test mode, the source voltage of the PMOS transistor PT1=VSS_Cell, the back gate voltage=VDD, so the voltage Vbs=VDD−VSS_Cell≈0.6V. That is, in the screening test mode, a back bias (substrate bias) of 0.6V is applied to the PMOS transistor PT1. Accordingly, the threshold voltage |Vth(PT1)| of the PMOS transistor PT1 rises by about 0.1V due to the back bias effect (effect of raising the threshold voltage upon application of the back bias). The rise of the threshold voltage changes depending on the characteristic of the transistor.

As shown in FIG. 5, the source potential VSS_Cell is given by the following equation.

$$VSS\_Cell = VP1 + |Vth(PT1)|$$

When the threshold voltage of the PMOS transistor PT1 rises by Δ|Vth(PT1)|, the source potential VSS_Cell also rises by the threshold rise of the PMOS transistor PT1.

FIG. 6 is a graph illustrating the leakage current of the memory cell array 11 and the load characteristic of the PMOS transistor PT1. FIG. 6 shows the load characteristics of the PMOS transistor PT1 in the screening test mode (TEST=H) and the normal mode (TEST=L). The abscissa axis represents the source potential VSS_Cell (arbitrary unit: Arb. Unit). The ordinate axis represents the current (arbitrary unit), and represents the leakage current for the memory cell array 11 and a drain current Ids for the load characteristic.

The level of the source potential VSS_Cell converges to a level at which the leakage current of the memory cell array 11 and the drain current of the PMOS transistor PT1 balance with each other. As shown in FIG. 6, the balance level for the source potential VSS_Cell in the screening test mode (TEST=H) becomes higher than that in the normal mode (TEST=L) by the rise (Δ|Vth(PT1)|) of the threshold voltage.

FIG. 7 is a chart illustrating a level change in the source potential VSS_Cell after the SRAM enters the standby mode (/SLP=L). The abscissa axis represents the time (arbitrary unit: Arb. Unit). The ordinate axis represents the source potential VSS_Cell (arbitrary unit: Arb. Unit).

In the standby mode, the level of the source potential VSS_Cell gradually rises due to the leakage current of the memory cell array 11, and converges to the balance level shown in FIG. 6. In the screening test mode (TEST=H), the source potential VSS_Cell converges at a level higher than that in the normal mode (TEST=L) by the rise (Δ|Vth(PT1)|) of the threshold voltage.

As a result, the cell bias VCB in the screening test mode becomes lower by about 0.1V than that in the normal mode. A chip having a small margin of the retention characteristic can be screened.

Note that the rise of the threshold voltage by the back bias effect also changes depending on the channel length of the MOS transistor. Generally in a semiconductor device which shrinks in feature size, if the channel length is short, the back bias effect is small owing to a short channel effect. The channel length of the PMOS transistor PT1 is desirably set in advance so as to obtain a desired rise of the threshold voltage.

The channel length of the MOS transistor is generally set to a minimum feature size (minimum processing size) which is determined by the design rule corresponding to the generation (specifically, the precision of the exposure apparatus). In the first embodiment, the channel length of the PMOS transistor PT1 is set larger than the minimum feature size. This makes it possible to more effectively control the threshold voltage of the PMOS transistor PT1.

As described above in detail, according to the first embodiment, the cell bias VCB can be decreased by raising the level of the source potential VSS_Cell of the memory cell array 11 in the standby mode. Hence, the leakage current from the memory cell array 11 can be reduced.

By increasing the back bias of the clamp PMOS transistor PT1, the level of the source potential VSS_Cell in the screening test mode can be set higher than that in the normal mode. Since the cell bias in the standby mode can be changed, a chip of a poor retention characteristic can be screened.

The bias generation circuit 22 is configured so that the bias potential VP1 reflects variations in the potential difference between the power supply potential VDD and the ground potential VSS, and variations (mainly a process error) in the threshold voltage Vth of the transistor. Even if VDD fluctuates or the threshold voltage fluctuates, the source potential VSS_Cell changes following the variations, and the cell bias VCB applied to the memory cell MC always maintains a proper level. The cell bias VCB can be effectively relaxed to further reduce the standby leakage.

SECOND EMBODIMENT

In the first embodiment, a PMOS transistor is used as the clamp MOS transistor. However, an NMOS transistor can also be used.

Figure 8:
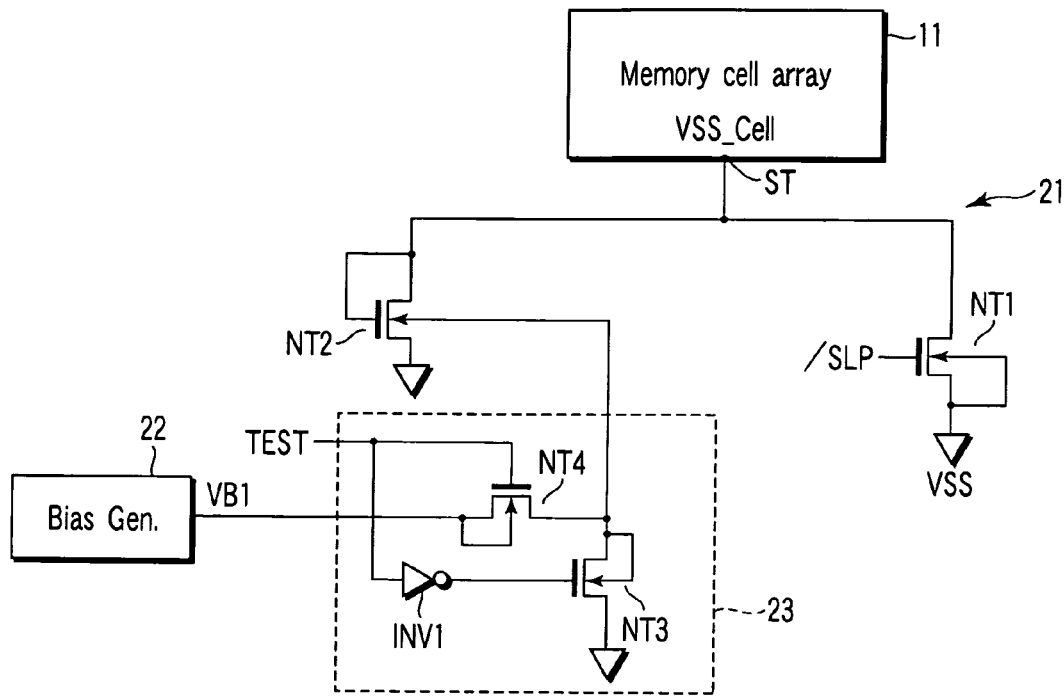
FIG. 8 is a circuit diagram illustrating a cell bias control circuit 21 according to the second embodiment of the present invention.

FIG. 8 is a circuit diagram illustrating a cell bias control circuit 21 according to the second embodiment of the present invention. A source terminal ST is connected to a clamp NMOS transistor NT2. The gate and drain terminals of the NMOS transistor NT2 are connected (diode-connected). The drain terminal of the NMOS transistor NT2 is connected to the source terminal ST. The source terminal of the NMOS transistor NT2 is connected to the ground potential VSS.

The back gate terminal of the NMOS transistor NT2 is connected to a level switching circuit 23 for switching the potential level of the back gate terminal. The level switching circuit 23 comprises NMOS transistors NT3 and NT4 and an inverter circuit INV1.

The source and back gate terminals of the NMOS transistor NT3 are connected to the back gate terminal of the NMOS transistor NT2. The drain terminal of the NMOS transistor NT3 is connected to the ground potential VSS. The gate terminal of the NMOS transistor NT3 receives a test signal TEST via the inverter circuit INV1 (i.e., receives an inverted signal of the test signal TEST).

The drain terminal of the NMOS transistor NT4 is connected to the back gate terminal of the NMOS transistor NT2. The gate terminal of the NMOS transistor NT4 receives the test signal TEST. The source terminal of the NMOS transistor NT4 receives a bias potential VB1. The bias potential VB1 is generated by a bias generation circuit 22. The bias potential VB1 is set to a value lower than the ground potential VSS. The back gate terminal of the NMOS transistor NT4 is connected to its source terminal.

In the SRAM having this arrangement, the gate terminal of the clamp NMOS transistor NT2 is connected to the source potential VSS_Cell. The level of the source potential VSS_Cell is clamped (is held) at a level higher than the ground potential VSS by the threshold voltage Vth(NT2) of the NMOS transistor NT2.

In the screening test mode (TEST=H), the back bias of the NMOS transistor NT2 is set to a level lower than the ground potential VSS. With this setting, as the threshold voltage Vth(NT2) of the NMOS transistor NT2 rises, the level of the source potential VSS_Cell rises.

In this manner, even when the NMOS transistor is used as the clamp MOS transistor, a chip of a poor retention characteristic can be screened.

THIRD EMBODIMENT

In the first embodiment, the back gate terminal of the clamp PMOS transistor PT1 is set to the power supply potential VDD in the screening test mode. A screening test using the back bias effect can also be performed as far as the back gate terminal of the clamp PMOS transistor PT1 is at a level higher than the source potential VSS_Cell. In the third embodiment, the back gate terminal of the clamp PMOS transistor PT1 is set to a potential other than the power supply potential VDD in the screening test mode.

Figure 9:
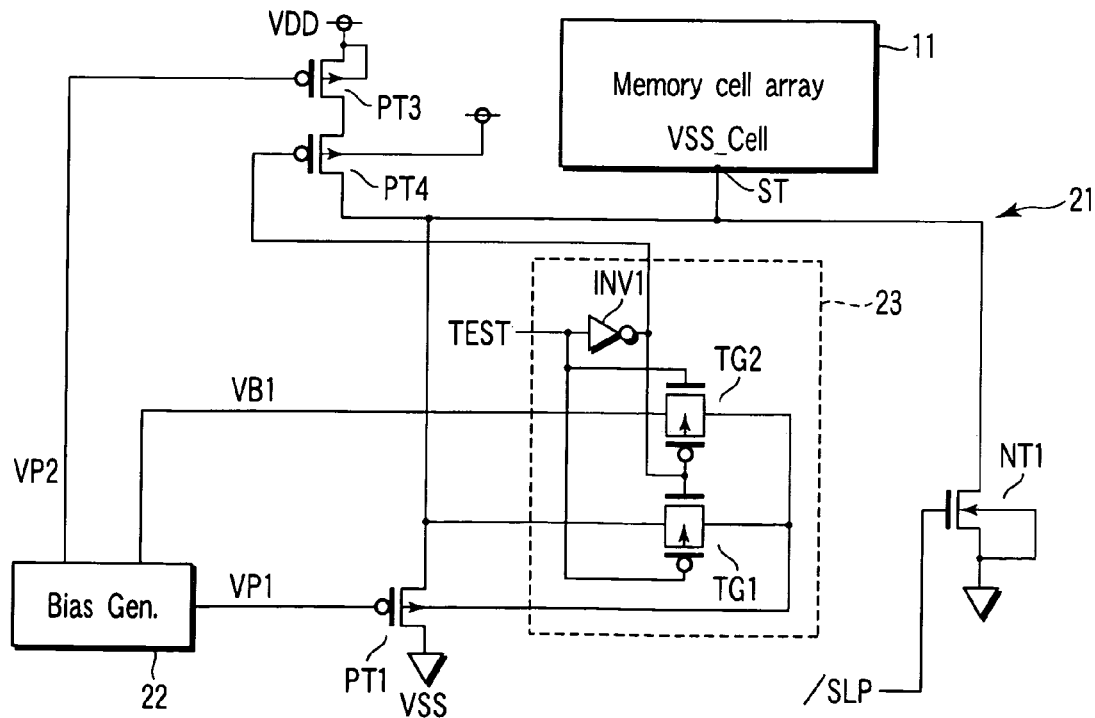
FIG. 9 is a circuit diagram illustrating a cell bias control circuit 21 according to the third embodiment of the present invention.

FIG. 9 is a circuit diagram illustrating a cell bias control circuit 21 according to the third embodiment of the present invention. A bias generation circuit 22 generates bias potentials VP1 and VB1. The bias potential VB1 is set to a potential (in the third embodiment, for example, an intermediate potential between the power supply potential VDD and the ground potential VSS) lower than the power supply potential VDD.

The input terminal of a transfer gate TG2 receives the bias potential VB1. The output terminal of the transfer gate TG2 is connected to the back gate terminal of a PMOS transistor PT1. The transfer gate TG2 is turned on when the test signal TEST is at high level (in the screening test mode).

In the screening test mode, the back gate terminal of the PMOS transistor PT1 receives an intermediate potential between the power supply potential VDD and the ground potential VSS. Compared to the first embodiment, the rise of the source potential VSS_Cell can be set as small as about several ten mV.

In the screening test mode, the level of the source potential VSS_Cell can also be set higher. In FIG. 9, the cell bias control circuit 21 comprises a pull-up PMOS transistor PT3 and a PMOS transistor PT4 serving as a switching element.

The source and back gate terminals of the PMOS transistor PT3 are connected to the power supply potential VDD. The drain terminal of the PMOS transistor PT3 is connected to the source terminal of the PMOS transistor PT4. The drain terminal of the PMOS transistor PT4 is connected to the source terminal ST.

The gate terminal of the PMOS transistor PT4 receives an inverted signal of the test signal TEST. The gate terminal of the PMOS transistor PT3 receives a bias potential VP2 from the bias generation circuit 22.

The current drivability of the PMOS transistor PT3 is set small. For example, the current drivability of the PMOS transistor PT3 is set smaller than that of the PMOS transistor PT1. As the setting method, the level of the bias potential VP2 is adjusted, or the gate length of the PMOS transistor PT3 is adjusted.

According to the method of adjusting the level of the bias potential VP2, the bias potential VP2 can be set to about an intermediate potential between the power supply potential VDD and the ground potential VSS. This setting can decrease the current drivability of the PMOS transistor PT3.

According to the method of adjusting the gate length of the PMOS transistor PT3, the gate length is set larger than the minimum feature size. Further, the gate length of the PMOS transistor PT3 is set larger than that of the PMOS transistor PT1. This setting can decrease the current drivability of the PMOS transistor PT3.

In the SRAM having this arrangement, the PMOS transistor PT4 is turned on in the screening test mode. Since the PMOS transistor PT3 is rendered conductive weakly (or the current drivability is small), the source terminal ST is weakly connected to the power supply potential VDD. By rendering the PMOS transistor PT3 conductive weakly, the potential of the source terminal ST can be pulled up to the power supply potential VDD. Consequently, the rise of the source potential VSS_Cell can be adjusted.

FOURTH EMBODIMENT

In the first embodiment, the threshold voltage is controlled by switching the potential level of the back gate terminal of the clamp PMOS transistor PT1 in the screening test mode. The threshold voltage can also be controlled by another method. In the fourth embodiment, the threshold voltage of a clamp PMOS transistor PT1 is controlled using a DIBL (Drain Induced Barrier Lowering) effect. By the DIBL effect, the threshold voltage of the MOS transistor rises as the voltage Vds between the drain and source of the MOS transistor drops.

Figure 10:
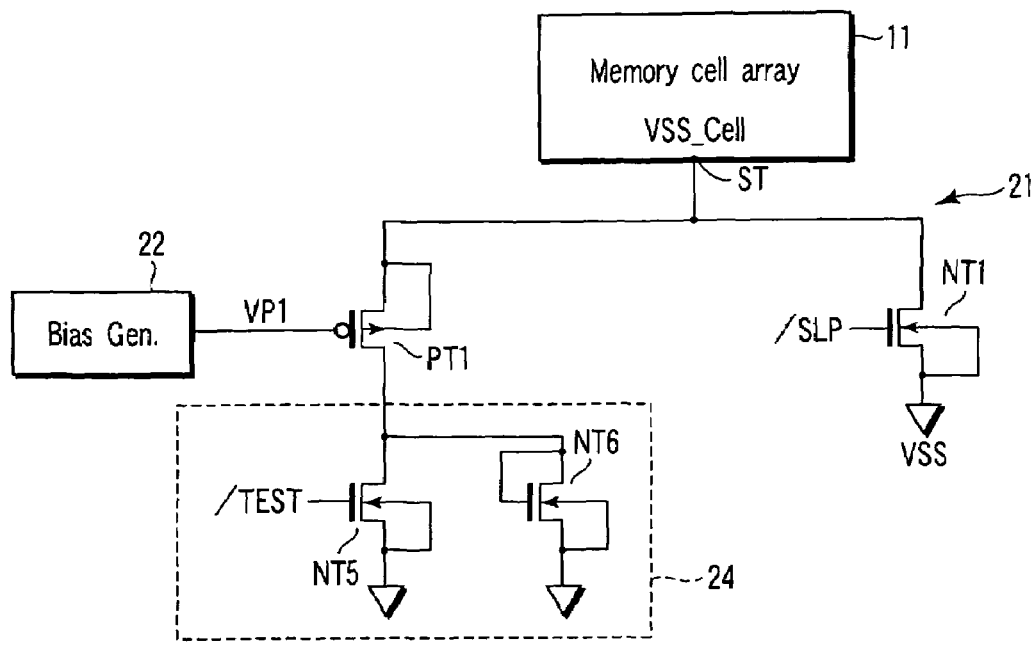
FIG. 10 is a circuit diagram illustrating a cell bias control circuit 21 according to the fourth embodiment of the present invention.

FIG. 10 is a circuit diagram illustrating a cell bias control circuit 21 according to the fourth embodiment of the present invention. The back gate terminal of the clamp PMOS transistor PT1 is connected to its source terminal. The drain terminal of the clamp PMOS transistor PT1 is connected to a threshold control circuit 24.

The threshold control circuit 24 comprises two NMOS transistors NT5 and NT6. The drain terminals of the NMOS transistors NT5 and NT6 are connected to that of the PMOS transistor PT1. The source and back gate terminals of the NMOS transistors NT5 and NT6 are connected to the ground potential VSS. The gate terminal of the NMOS transistor NT6 is connected to its drain terminal.

The gate terminal of the NMOS transistor NT5 receives a test signal /TEST. The test signal /TEST changes to low level in the screening test mode and high level in the normal mode.

In the SRAM having this arrangement, the NMOS transistor NT5 is turned on in the normal mode (/TEST=H). Then, the source terminal potential of the PMOS transistor PT1=VSS_Cell, and the drain terminal potential=VSS. As a result, the voltage |Vds| between the drain and source of the PMOS transistor PT1=VSS_Cell.

In the screening test mode (/TEST=L), the NMOS transistor NT5 is turned off. Then, the source terminal potential of the PMOS transistor PT1=VSS_Cell, and the drain terminal potential=Vth(NT6). Resultantly, the voltage |Vds| between the drain and source of the PMOS transistor PT1=VSS_Cell−Vth(NT6). In the screening test mode, |Vds| of the PMOS transistor PT1 becomes smaller than that in the normal mode.

If |Vds| of the PMOS transistor PT1 decreases, the threshold voltage |Vth(PT1)| of the PMOS transistor PT1 slightly rises due to the DIBL effect. The source potential VSS_Cell rises, and the screening test can be performed, similar to the first embodiment. Since the rise of the threshold voltage by the DIBL effect is as small as about several ten mV, the source potential VSS_Cell can be adjusted to a desired level by a combination with the first embodiment or the like.

FIFTH EMBODIMENT

In order to execute a satisfactory screening test, the test must wait until the VSS_Cell level completely converges, as shown in FIG. 7. However, a long time is taken to raise the VSS_Cell level due to the leakage current of the memory cell array 11, and a time of several μs to several ms is generally required. Since an increase in test time raises the test cost, the test time is desirably shortened as much as possible. In the fifth embodiment, the VSS_Cell level is forcibly pulled up to a predetermined potential level.

Figure 11:
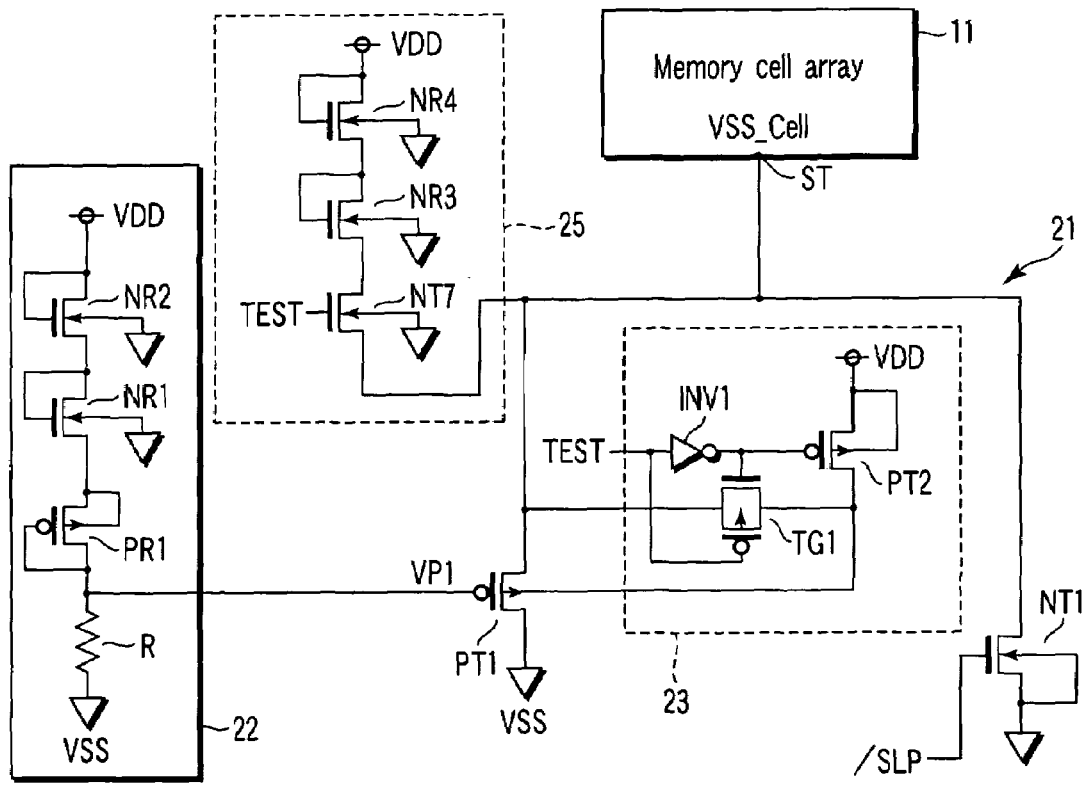
FIG. 11 is a circuit diagram illustrating a cell bias control circuit 21 according to the fifth embodiment of the present invention.

FIG. 11 is a circuit diagram illustrating a cell bias control circuit 21 according to the fifth embodiment of the present invention. The cell bias control circuit 21 comprises a level converging circuit 25 for shortening the time until the VSS_Cell level converges.

The level converging circuit 25 is formed by series-connecting NMOS transistors NR4 and NR3, and an NMOS transistor NT7 serving as a switching element between the power supply potential VDD and a source terminal ST in the order named from the side of the power supply potential VDD. The NMOS transistors NR3 and NR4 are replica transistors of the driving NMOS transistor (DV1 or the like) in a memory cell MC.

The gate and drain terminals of each of the NMOS transistors NR3 and NR4 are connected (diode-connected). The back gate terminals of the NMOS transistors NR3 and NR4 are connected to the ground potential VSS. The gate terminal of the NMOS transistor NT7 receives a test signal TEST. The back gate terminal of the NMOS transistor NT7 is connected to the ground potential VSS.

In the SRAM having the above arrangement, the source potential VSS_Cell is set by a bias generation circuit 22 in the normal mode:

$$VSS\_Cell = VDD - 2 \times Vth(DV)$$

where Vth(DV) is the threshold voltage of the driving NMOS transistor in the memory cell MC.

In the screening test mode, the threshold voltage of the PMOS transistor PT1 rises, and the source potential VSS_Cell is set by the following equation.

$$VSS\_Cell = VDD - 2 \times Vth(DV) + \Delta|Vth(PT1)|$$

where Δ|Vth(PT1)| is the rise of the threshold voltage of the PMOS transistor PT1 upon application of the back bias.

In the screening test mode, the NMOS transistor NT7 is turned on, and the VSS_Cell level is pulled up by the NMOS transistors NR3 and NR4. When the VSS_Cell level reaches VDD−2×Vth(DV), the NMOS transistors NR3 and NR4 are turned off.

Figure 12:
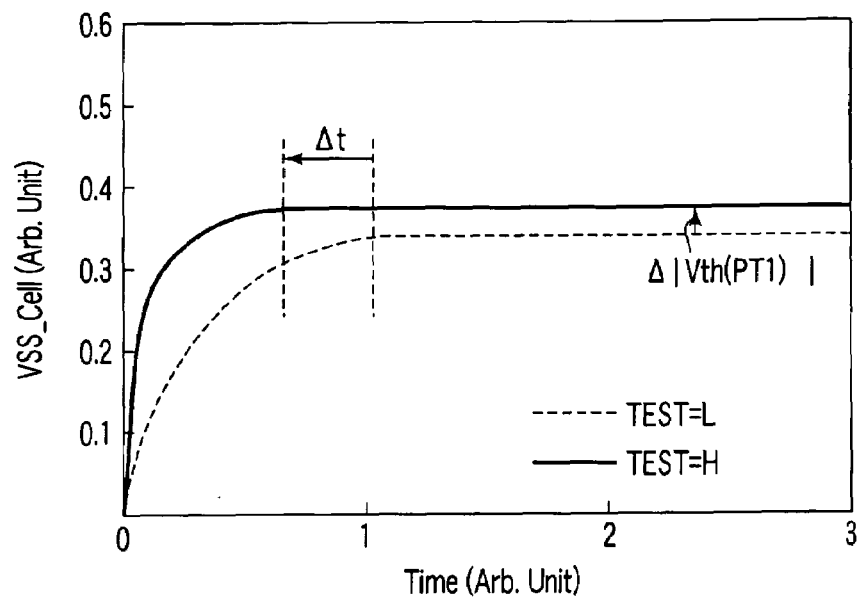
FIG. 12 is a chart illustrating a level change in source potential VSS_Cell after the SRAM enters the standby mode according to the fifth embodiment.

FIG. 12 is a chart illustrating a level change in the source potential VSS_Cell after the SRAM enters the standby mode (/SLP=L). The abscissa axis represents the time (arbitrary unit: Arb. Unit). The ordinate axis represents the source potential VSS_Cell (arbitrary unit: Arb. Unit).

As shown in FIG. 12, the VSS_Cell level is forcibly pulled up toward the power supply potential VDD by the NMOS transistors NR3 and NR4 until the VSS_Cell level reaches VDD−2×Vth(DV). More specifically, the VSS_Cell level is forcibly pulled up to a potential obtained by subtracting the rise Δ|Vth(PT1)| of the threshold voltage of the PMOS transistor PT1 from a potential finally clamped by the PMOS transistor PT1.

After that, the VSS_Cell level rises by the rise Δ|Vth(PT1)| of the threshold voltage owing to the leakage current of the memory cell array 11. Under this control, the time until the VSS_Cell level converges can be shortened (by the time Δt in FIG. 12), reducing the test cost.

Figure 13:
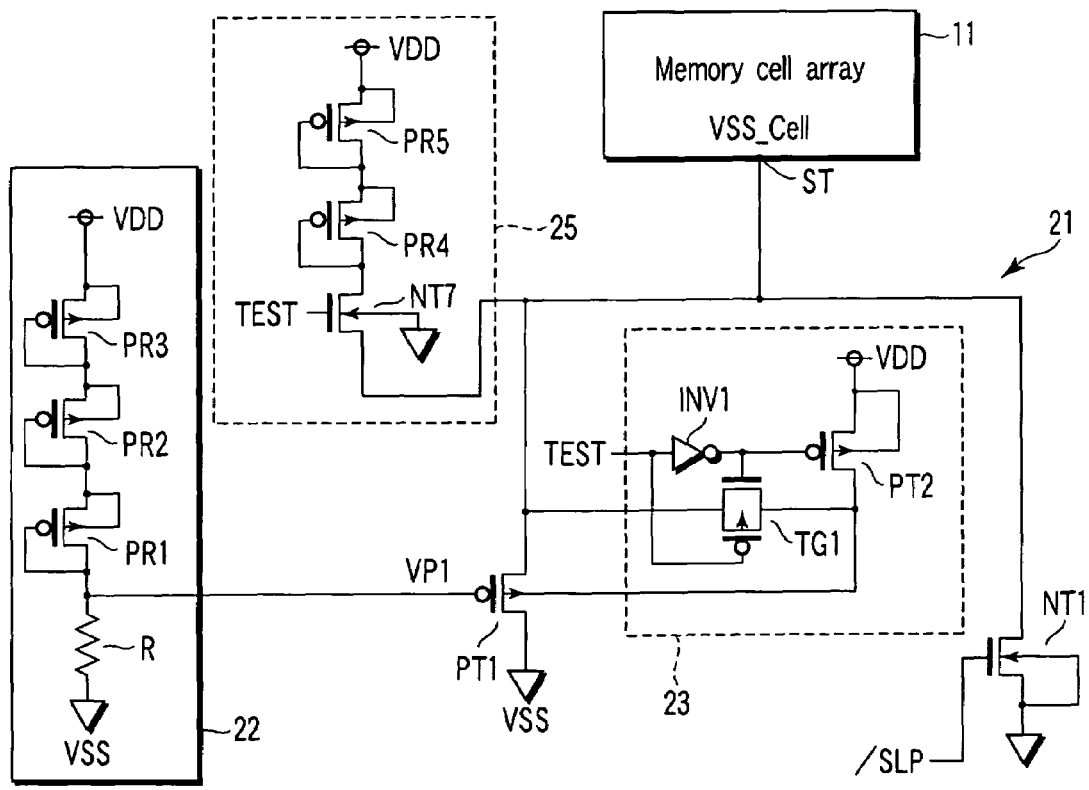
FIG. 13 is a circuit diagram illustrating anther example of the arrangement of the cell bias control circuit 21 according to the fifth embodiment.

Note that the bias generation circuit 22 is formed from replicas of the driving NMOS transistor in FIG. 11, but can also be formed from replicas of a load PMOS transistor. FIG. 13 shows an example of an arrangement when the bias generation circuit 22 uses replicas of the load PMOS transistor.

Two PMOS transistors PR2 and PR3 included in the bias generation circuit 22 shown in FIG. 13 are replica transistors of the load PMOS transistor (LD1 or the like) in the memory cell MC. The gate and drain terminals of each of the PMOS transistors PR2 and PR3 are connected (diode-connected). The back gate terminals of the PMOS transistors PR2 and PR3 are connected to their source terminals.

Similarly, two PMOS transistors PR4 and PR5 included in the level converging circuit 25 shown in FIG. 13 are replica transistors of a load PMOS transistor (LD1 or the like) in the memory cell MC.

Even when the bias generation circuit 22 and level converging circuit 25 are composed in the above way, the time until the VSS_Cell level converges can be shortened.

Figure 14:
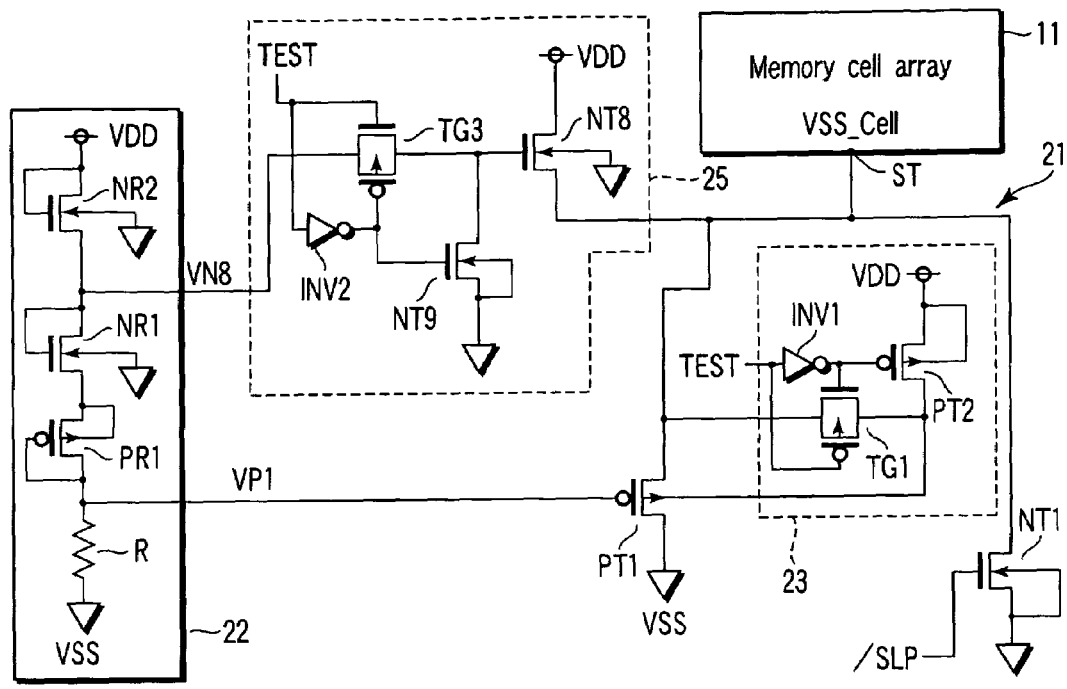
FIG. 14 is a circuit diagram illustrating still anther example of the arrangement of the cell bias control circuit 21 according to the fifth embodiment.

FIG. 14 shows an example of an arrangement in which a potential for forcibly pulling up the VSS_Cell level is supplied from the bias generation circuit 22. The level converging circuit 25 comprises NMOS transistors NT8 and NT9, an inverter circuit INV2, and a transfer gate TG3.

The bias generation circuit 22 generates a bias potential VN8. The bias potential VN8 is output from the source terminal of the NMOS transistor NR2 (or the drain terminal of the NMOS transistor NR1). That is, the bias potential VN8 is set to VDD−Vth(NR2).

The bias potential VN8 is supplied to the gate terminal of the NMOS transistor NT8 via the transfer gate TG3. The transfer gate TG3 is turned on when the test signal TEST is at high level. The drain terminal of the NMOS transistor NT8 is connected to the power supply potential VDD. The source terminal of the NMOS transistor NT8 is connected to the source terminal ST. The back gate terminal of the NMOS transistor NT8 is connected to the ground potential VSS.

The drain terminal of the NMOS transistor NT9 is connected to the gate terminal of the NMOS transistor NT8. The source and back gate terminals of the NMOS transistor NT9 are connected to the ground potential VSS. The gate terminal of the NMOS transistor NT9 receives an inverted signal of the test signal TEST.

In the normal mode (TEST=L), the transfer gate TG3 is turned off, and the NMOS transistor NT9 is turned on. Hence, the NMOS transistor NT8 is turned off. As a result, the source terminal ST does not receive any pull-up potential from the level converging circuit 25.

In the screening test mode (TEST=H), the transfer gate TG3 is turned on, and the NMOS transistor NT9 is turned off. The gate terminal of the NMOS transistor NT8 receives the bias potential VN8. As a result, the VSS_Cell level is forcibly pulled up to a level of VN8−Vth(NT8).

Even when the bias generation circuit 22 and level converging circuit 25 are built in the above fashion, the time until the VSS_Cell level converges can be shortened.

SIXTH EMBODIMENT

The above embodiments control the source potential VSS_Cell which is a lower power supply potential in the memory cell array 11. However, the present invention can also be applied to a case wherein a source potential VDD_Cell serving as a higher power supply potential in the memory cell array 11 is controlled. The sixth embodiment is related to an example of an arrangement when the source potential VDD_Cell of a memory cell array 11 is controlled.

Figure 15:
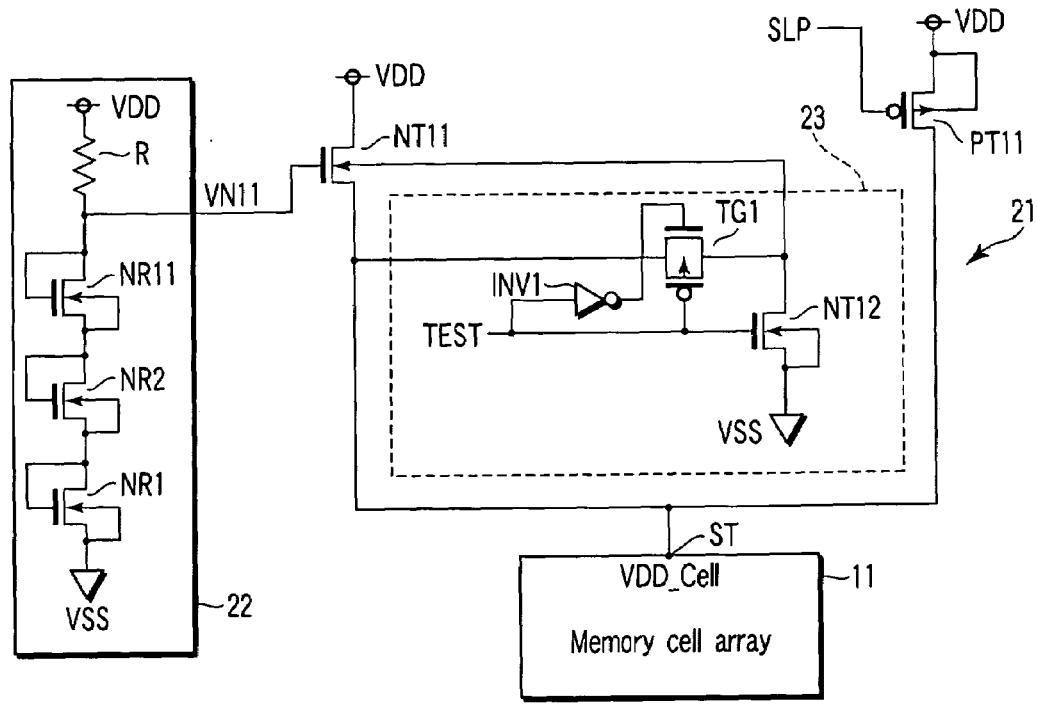
FIG. 15 is a circuit diagram illustrating a cell bias control circuit 21 according to the sixth embodiment of the present invention.

FIG. 15 is a circuit diagram illustrating a cell bias control circuit 21 according to the sixth embodiment of the present invention. The cell bias control circuit 21 is connected to the source potential VDD_Cell of the memory cell array 11 via a source terminal ST. The source terminal ST is connected to the source terminals of load PMOS transistors LD1 and LD2 in the memory cell MC shown in FIG. 2. The source potential VDD_Cell corresponds to the source potentials of the load PMOS transistors LD1 and LD2.

The cell bias control circuit 21 comprises a bias generation circuit 22, level switching circuit 23, clamp NMOS transistor NT11, and PMOS transistor PT11 for supplying the power supply potential VDD.

The drain terminal of the PMOS transistor PT11 is connected to the source terminal ST of the memory cell array 11. The source and back gate terminals of the PMOS transistor PT11 are connected to the power supply potential VDD. The gate terminal of the PMOS transistor PT11 receives, e.g., a standby signal SLP supplied from the control circuit 17.

The standby signal SLP changes to low level in the normal operation mode and high level in the standby mode. By the standby signal SLP, the PMOS transistor PT11 is turned on in the normal operation mode and off in the standby mode.

The source terminal of the NMOS transistor NT11 is connected to the source terminal ST. The drain terminal of the NMOS transistor NT11 is connected to the ground potential VSS. The gate terminal of the NMOS transistor NT11 receives a bias potential VN11 from the bias generation circuit 22.

The bias generation circuit 22 is formed by series-connecting NMOS transistors NR1, NR2, and NR11, and a resistor R between the ground potential VSS and the power supply potential VDD in the order named from the side of the power supply potential VDD. The NMOS transistors NR1 and NR2 are formed from replica transistors of the driving NMOS transistor (DV1 or the like) included in the memory cell MC. The NMOS transistor NR11 is formed from a replica transistor of the NMOS transistor NT11.

The gate and drain terminals of each of the NMOS transistors NR1, NR2, and NR11 are connected (diode-connected). The back gate terminals of the NMOS transistors NR1, NR2, and NR11 are connected to their source terminals.

The bias potential VN11 is set between the power supply potential VDD and the ground potential VSS. Moreover, the bias potential VN11 is set to satisfy a condition under which data stored in the memory cell MC is not destroyed by the level drop of the source potential VDD_Cell. In the bias generation circuit 22 according to the sixth embodiment, the bias potential VN11 is given by the following equation.

$$VN11 = VSS + Vth(NR1) + Vth(NR2) + Vth(NR11)$$

The level switching circuit 23 comprises an NMOS transistor NT12, transfer gate TG1, and inverter circuit INV1. In the normal mode (TEST=L), the transfer gate TG1 electrically connects the back gate terminal of the NMOS transistor NT11 and the source terminal ST.

The drain terminal of the NMOS transistor NT12 is connected to the back gate terminal of the NMOS transistor NT11. The source and back gate terminals of the NMOS transistor NT12 are connected to the ground potential VSS. The gate terminal of the NMOS transistor NT12 receives the test signal TEST.

In the screening test mode (TEST=H), the NMOS transistor NT12 is turned on, and the transfer gate TG1 is turned off. Accordingly, the back gate terminal of the NMOS transistor NT11 is connected to the ground potential VSS.

Figure 16:
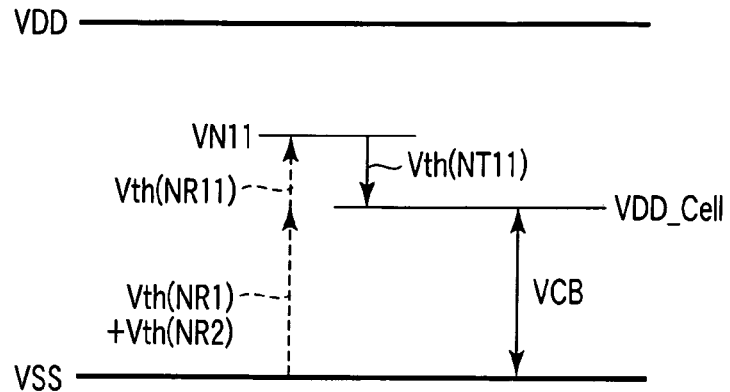
FIG. 16 is a chart illustrating the potential relationship of the SRAM in the standby mode according to the sixth embodiment.

As shown in FIG. 16, the source potential VDD_Cell is given by the following equation.

$$VDD\_Cell = VN11 - Vth(NT11)$$

With this arrangement, when the threshold voltage of the NMOS transistor NT11 rises, the source potential VDD_Cell drops by the rise of the threshold of the NMOS transistor NT11. A chip having a small margin of the retention characteristic can be screened.

SEVENTH EMBODIMENT

Figure 17:
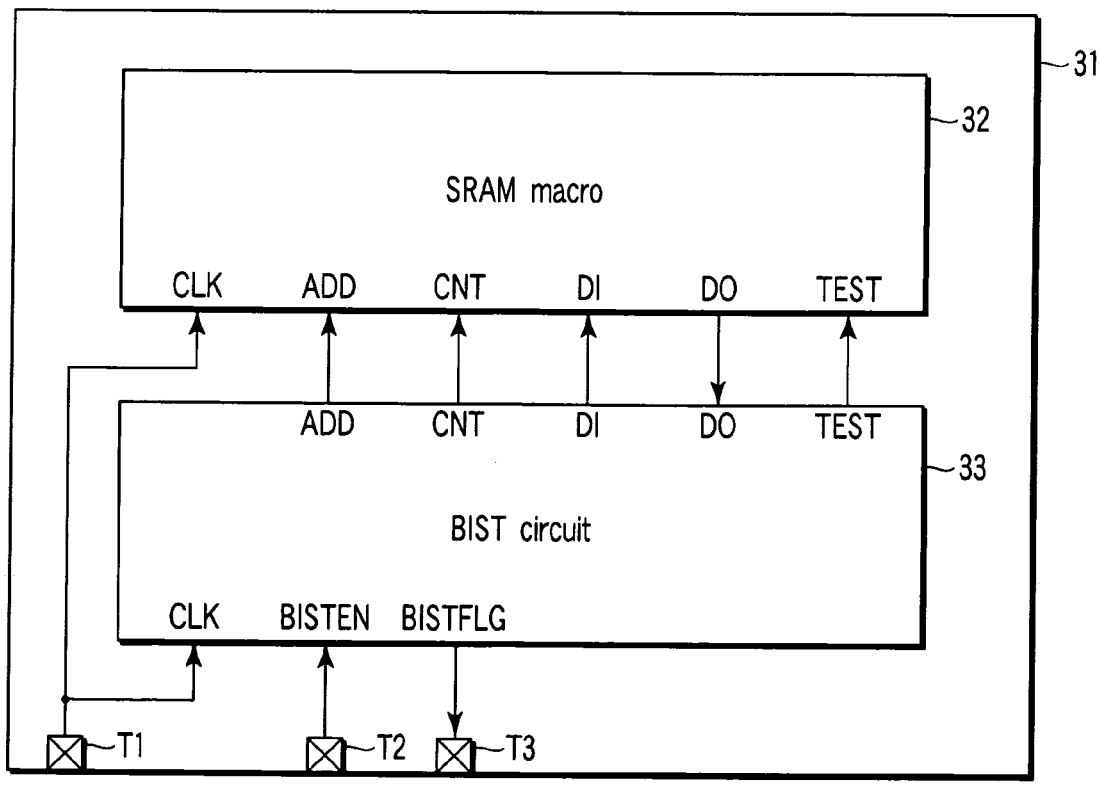
FIG. 17 is a block diagram illustrating a semiconductor integrated circuit 31 according to the seventh embodiment of the present invention.

FIG. 17 is a block diagram illustrating a semiconductor integrated circuit (system chip) 31 according to the seventh embodiment of the present invention.

The system chip 31 comprises an SRAM macro 32 and BIST (Built-In Self Test) circuit 33. The SRAM macro 32 corresponds to the SRAM (including the cell bias control circuit 21) described in the above embodiments.

The system chip 31 externally receives a clock signal CLK and test enable signal BISTEN. The clock signal CLK is input to the SRAM macro 32 and BIST circuit 33 via a terminal T1. The test enable signal BISTEN is input to the BIST circuit 33 via a terminal T2.

When the test enable signal BISTEN is enabled, the BIST circuit 33 executes a test for the SRAM macro 32. More specifically, the BIST circuit 33 generates an address signal ADD, control signal CNT (including a standby signal /SLP), input data DI, and test signal TEST which are necessary for a test. The BIST circuit 33 supplies these signals to the SRAM macro 32 to execute a screening test for the SRAM macro 32.

The SRAM macro 32 outputs output data DO. On the basis of the output data DO, the BIST circuit 33 determines the result of the screening test. That is, the BIST circuit 33 determines whether the SRAM macro 32 has a desired retention characteristic. Then, the BIST circuit 33 generates a flag signal BISTFLG representing the determination result. The flag signal BISTFLG is externally output via a terminal T3.

As described above in detail, the seventh embodiment can implement the system chip 31 including the SRAM macro 32 and BIST circuit 33.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array including a plurality of memory cells each of which is of a static type and includes a driving MIS (Metal Insulator Semiconductor) transistor and a load MIS transistor;
a source terminal which supplies a source potential to the memory cells;
a first switching element which electrically connects the source terminal and a first power supply potential in an operation mode of the memory cells, and electrically disconnects the source terminal and the first power supply potential in a standby mode of the memory cells;
a clamp MIS transistor which is series-connected between the source terminal and the first power supply potential, and clamps the source potential in the standby mode;
a bias generation circuit which supplies a first bias potential to a gate terminal of the clamp MIS transistor; and
a switching circuit which switches a potential of a back gate terminal of the clamp MIS transistor between a test mode and a non-test mode.

2. The device according to claim 1, wherein the switching circuit controls an absolute value of a threshold voltage of the clamp MIS transistor in the test mode to become larger than an absolute value of a threshold voltage of the clamp MIS transistor in the non-test mode.

3. The device according to claim 2, wherein the first power supply potential is a ground potential.

4. The device according to claim 3, wherein
the clamp MIS transistor is of a P type, and
the switching circuit supplies the source potential to the back gate terminal in the non-test mode, and supplies a second power supply potential to the back gate terminal in the test mode.

5. The device according to claim 4, further comprising a first pull-up MIS transistor which is series-connected between the second power supply potential and the source terminal, and pulls up the source potential toward the second power supply potential in the test mode.

6. The device according to claim 5, further comprising a second switching element which is connected between the first pull-up MIS transistor and the source terminal, and turns on in the test mode and off in the non-test mode.

7. The device according to claim 5, wherein
the bias generation circuit supplies a second bias potential to a gate terminal of the first pull-up MIS transistor, and
the second bias potential is set to a potential between the ground potential and the second power supply potential.

8. The device according to claim 5, wherein a current drivability of the first pullup MIS transistor is smaller than a current drivability of the clamp MIS transistor.

9. The device according to claim 4, further comprising a pull-up MIS transistor which is series-connected between the second power supply potential and the source terminal, and in the test mode, forcibly pulls up the source potential to a predetermined potential lower than a clamp potential at which the source potential is clamped by the clamp MIS transistor.

10. The device according to claim 9, wherein the predetermined potential is set to a potential obtained by subtracting a rise of the threshold voltage of the clamp MIS transistor from the clamp potential.

11. The device according to claim 9, wherein the pull-up MIS transistor is a replica of a MIS transistor included in the memory cell.

12. The device according to claim 9, further comprising a second switching element which is connected between the pull-up MIS transistor and the source terminal, and turns on in the test mode and off in the non-test mode.

13. The device according to claim 1, wherein the source potential is clamped in the standby mode by the clamp MIS transistor to a potential obtained by subtracting a threshold voltage of the clamp MIS transistor from the first bias potential.

14. The device according to claim 1, wherein a channel length of the clamp MIS transistor is larger than a minimum processing size determined by a design rule.

15. The device according to claim 1, wherein a threshold voltage of the clamp MIS transistor changes depending on a change in potential applied to the back gate terminal.

16. The device according to claim 1, wherein
the memory cell includes two inverter circuits,
an output of one inverter circuit of the two inverter circuits is connected to an input of the other inverter circuit,
each of the two inverter circuits has the driving MIS transistor and the load MIS transistor,
the driving MIS transistor is of an N type, and
the load MIS transistor is of a P-type.

17. A semiconductor memory device comprising:
a memory cell array including a plurality of memory cells each of which is of a static type and includes a driving MIS transistor and a load MIS transistor;
a first source terminal which supplies a source potential to the memory cells;
a first switching element which electrically connects the first source terminal and a first power supply potential in an operation mode of the memory cells, and electrically disconnects the first source terminal and the first power supply potential in a standby mode of the memory cells;
a clamp MIS transistor which has a source terminal connected to the first source terminal, and clamps the source potential in the standby mode;
a bias generation circuit which supplies a bias potential to a gate terminal of the clamp MIS transistor; and
a switching circuit which switches a potential of a drain terminal of the clamp MIS transistor between a test mode and a non-test mode.

18. The device according to claim 17, wherein
the first power supply potential is a ground potential, and
the switching circuit supplies the ground potential to the drain terminal of the clamp MIS transistor in the non-test mode, and supplies a drain potential higher than the ground potential to the drain terminal of the clamp MIS transistor in the test mode.

19. The device according to claim 18, wherein
the switching circuit includes a first MIS transistor which is series-connected between the drain terminal of the clamp MIS transistor and the ground potential, and has a gate terminal and a drain terminal connected to each other, and
the drain potential corresponds to a threshold voltage of the first MIS transistor.

20. A semiconductor integrated circuit comprising:
an SRAM (Static Random Access Memory) macro; and
a test circuit which executes a test for the SRAM macro,
the SRAM macro comprising
a memory cell array including a plurality of memory cells each of which is of a static type and includes a driving MIS transistor and a load MIS transistor;
a source terminal which supplies a source potential to the memory cells;
a first switching element which electrically connects the source terminal and a first power supply potential in an operation mode of the memory cells, and electrically disconnects the source terminal and the first power supply potential in a standby mode of the memory cells;
a clamp MIS transistor which is series-connected between the source terminal and the first power supply potential, and clamps the source potential in the standby mode;
a bias generation circuit which supplies a first bias potential to a gate terminal of the clamp MIS transistor; and
a switching circuit which switches a potential of a back gate terminal of the clamp MIS transistor between a test mode and a non-test mode.

* * * * *